United States Patent
Higashi

[11] Patent Number: 6,144,285
[45] Date of Patent: Nov. 7, 2000

[54] THERMAL SENSOR AND METHOD OF MAKING SAME

[75] Inventor: Robert E. Higashi, Shorewood, Minn.

[73] Assignee: Honeywell International Inc., Morristown, N.J.

[21] Appl. No.: 09/394,154

[22] Filed: Sep. 13, 1999

[51] Int. Cl.[7] .................................................. H01L 31/08
[52] U.S. Cl. ............................... 338/15; 338/18; 338/17; 257/467
[58] Field of Search ................................. 338/15, 18, 17; 257/467

[56] References Cited

U.S. PATENT DOCUMENTS

| | | | |
|---|---|---|---|
| Re. 36,136 | 3/1999 | Higashi et al. | 338/18 |
| 5,220,188 | 6/1993 | Higashi et al. | 338/18 |
| 5,286,976 | 2/1994 | Cole | 250/338.4 |
| 5,300,915 | 4/1994 | Higashi et al. | 338/18 |
| 5,399,897 | 3/1995 | Cunningham et al. | 257/467 |
| 5,450,053 | 9/1995 | Wood | 338/18 |
| 5,900,799 | 5/1999 | Morris | 338/18 |
| 5,939,971 | 8/1999 | Yong | 338/18 |

OTHER PUBLICATIONS

Article "Characterization of Expitaxially Grown Films of Vanadium Oxides", K.D. Rogers, J.A. Coath, M.C.Lovell, Cranfield Institute of Technology (RMCS), Shrivenham, Swindon, Wwiltshire, SN6 8LA, England, Received Jan. 21, 1991; accepted for publication May 1, 1991.

Primary Examiner—Karl D. Easthom
Attorney, Agent, or Firm—Ian D. Mackinnon

[57] ABSTRACT

A two level microbridge infrared thermal detector having an upper detector planar section (a) comprising a temperature responsive detector of an oxide of vanadium having a high TCR and a resistivity in the range of 20K ohms to 50K ohms per square sheet resistance, and (b) being supported above a lower section by leg portions of an oxide of vanadium having a resistivity of approximately 500 ohms per square sheet resistance.

20 Claims, 3 Drawing Sheets

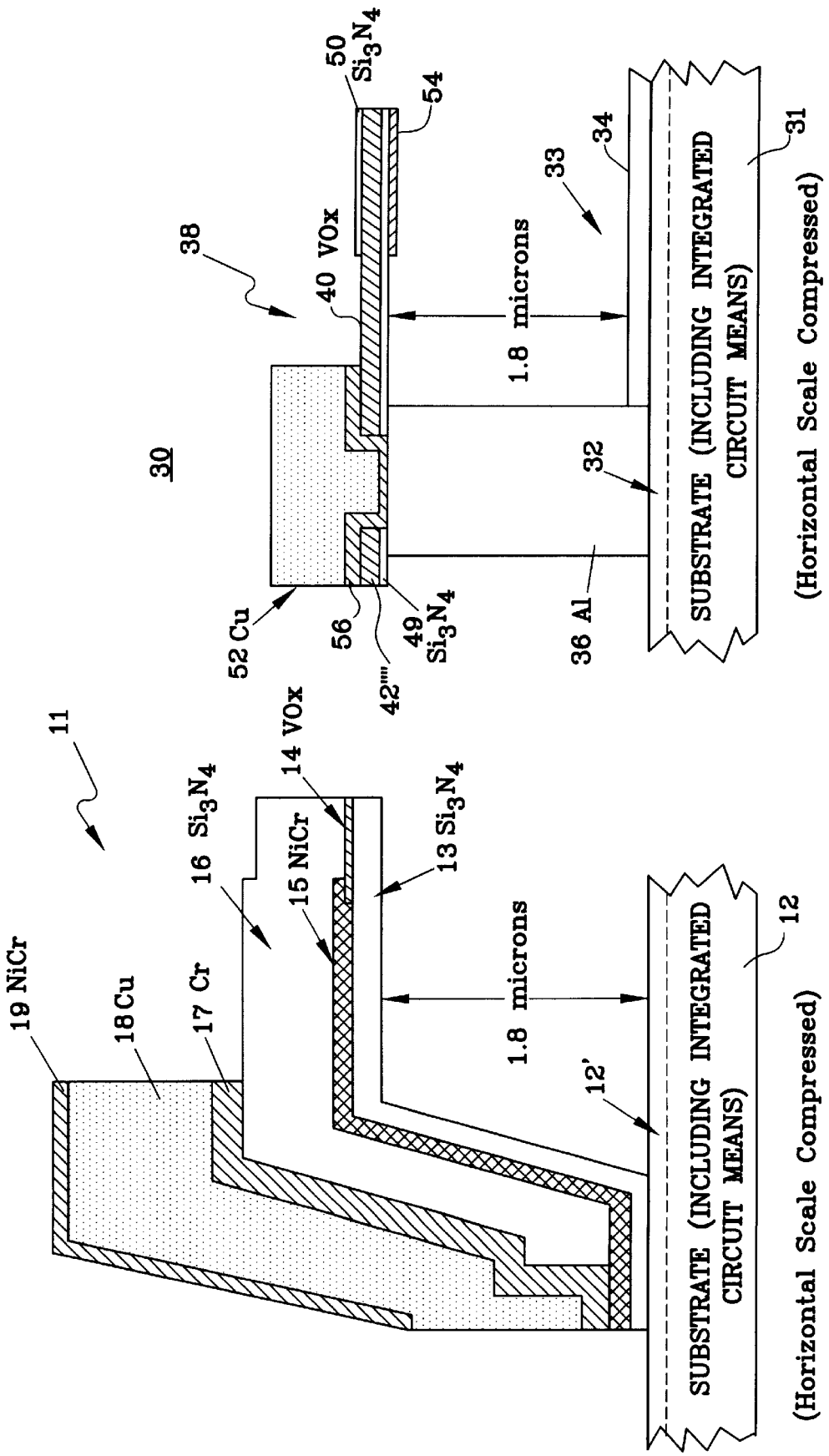

THERMAL SENSOR AND METHOD OF MAKING SAME

FIELD OF THE INVENTION

This invention relates to an improvement in bi-level infrared detectors with respect to which U.S. Pat. No. Re. 36,136 is an leading example and a method of making bi-level infrared detectors.

BACKGROUND OF THE INVENTION

There are a number of prior art bi-level infrared thermal detectors. Examples include U.S. Pat. No. Re. 36,136; U.S. Pat. Nos. 5,286,976 and 5,450,053.

The technology disclosed in U.S. Pat. No. Re. 36,136; U.S. Pat. Nos. 5,286,976 and 5,540,053 has proven to be a commercial success (a cross section of a pixel using this prior art technology is shown in FIG. 1); however, this technology is relatively complex due in part to the utilization of a so-called wet etch process used in the fabrication. A relativly large number of masks must be used in order to produce an array of pixels. This produces more mass and hence requires more energy to change temperature.

The technical disclosures of U.S. Pat. No. Re. 36,136; U.S. Pat. Nos. 5,286,976 and 5,450,053 are incorporated herein for reference.

SUMMARY OF THE INVENTION

The present invention, in one embodiment, provides a two-level microbridge infrared thermal detector comprising a pixel on a semiconductor substrate. The pixel has a lower section on the surface of the substrate which lower section includes integrated circuit means. The pixel also has an upper detector planar section spaced from and immediately above the lower section. The upper detector planar section comprises a temperature responsive detector of an oxide of vanadium characterized by having a high temperature coefficient of resistance (TCR) and a resistivity in the range of 5K ohm to 300K ohms per square sheet resistance. Further, the upper detector planar section is mechanically supported above the lower section by means including leg portions of an oxide of vanadium characterized by having a resistivity in the range of approximately 250 ohms to 1,000 ohms per square sheet resistance. The leg portions are electrically connected both to the detector and to the integrated circuit means. Further and importantly, the leg portions provide thermal isolation for the temperature responsive detector. In a typical application the invention takes the form of a large number of pixels arranged in an array and being positioned on a common semiconductor substrate. The thermal detector apparatus is further typically characterized by having the upper detector planar section for each of the pixels including absorber means. Also the thermal detector apparatus may be characterized by including a reflective layer on the substrate below the upper detector section so as to increase the overall sensitivity and efficiency of the apparatus.

The present invention provides support legs and contacts which use only a minimum area to thus maximize the thermal detectance absorption area; this is a significant attribute. Additionally, the thermal conductance from the detector is minimized. Further, the process for fabricating the sensor uses a much smaller number of photomasks (5) to surpass the performance of the sensors of the prior art "wet etch" process which use up to 13 photomasks. Thus, the unique process of this invention (i) minimizes the thermal mass, thermal conductance, and pixel size limits, and (ii) provides a smaller, lower cost detector.

BRIEF DESCRIPTION OF THE DRAWINGS

FIG. 1 is a cross section view of a prior art pixel using, in part, the technology of U.S. Pat. No. Re. 36,136; U.S. Pat. Nos. 5,286,976 and 5,450,053;

FIG. 2 is a cross section view of a pixel fabricated from the technology of the present invention;

Figure 4:
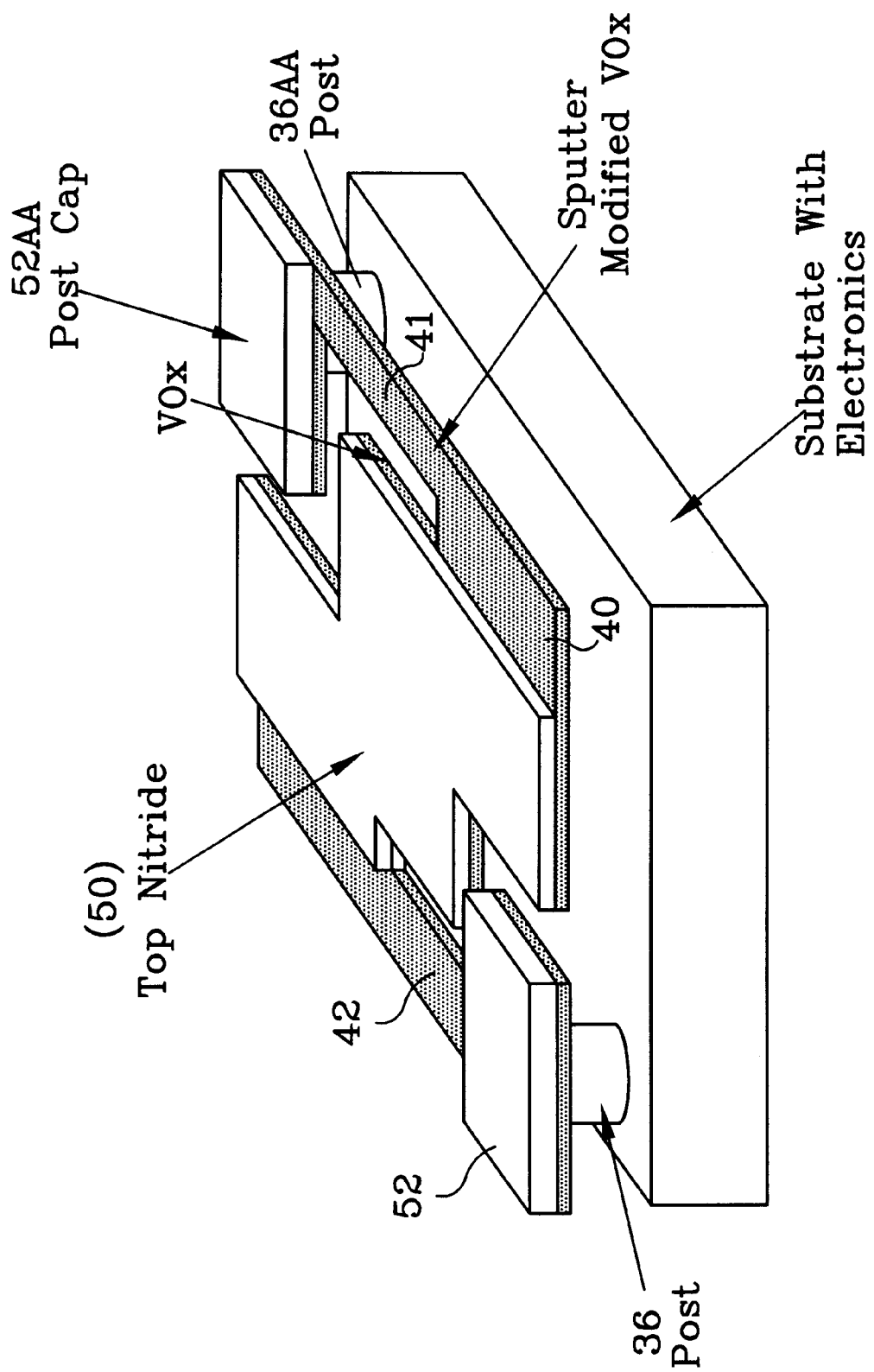
FIG. 4 is an annotated isometric view of the device of FIG. 2 as viewed from the top left thereof.

It should be noted that both FIGS. 1, 2 and 4 have the horizontal scale compressed so as to permit satisfactory depiction of the vertical scale of the disclosed pixels.

DETAILED DESCRIPTION OF THE INVENTION

The prior art bi-level microbridge pixel 10 shown in FIG. 1 comprises in part a substrate 12 which includes integrated circuit means 12' and thus comprises a lower section of the pixel. The integrated circuit means may follow the teaching of U.S. Pat. No. Re 36,136. The upper section 11 is a complex multilayer structure made from the use of the technology, with a plurality of steps, as disclosed in U.S. Pat. No. Re. 36,136; U.S. Pat. Nos. 5,286,976 and 5,450,053 the result being an upper detector section 11 spaced from and supported immediately above the lower section 12, a spacing of 1.8 microns being a desirable spacing for many applications and utilizations of the pixel as is well understood by those skilled in the art.

More specifically the prior art detector 10 comprises a series of successive layers 13–19: a first layer 13 of $Si_3N_4$ on which are deposited a thin layer 14 of VOx (an oxide of vanadium); a layer 15 of NiCr; a layer 16 of $Si_3N_4$; a layer 17 of Cr; a plug 18 of Cu; and a layer 19 of NiCr. Thus the prior art pixel of FIG. 1 has a large number of layers which causes the pixel to hang a relatively heavy mass which then necessitates a larger amount of energy to change the temperature of the pixel.

A pixel 30 fabricated in accordance with the technology of the present invention is depicted in FIG. 2. As in the prior art device, the pixel includes a lower section 33 having a semiconductor substrate 31 which includes integrated circuit means 32; the integrated circuit means may be achieved utilizing the teaching of U.S. Pat. No. Re 36,136.

A reflective layer 34 may be applied to the top surface of substrate 31; a thin layer of indium tin oxide may be selected for this layer. The reflective layer functions to increase the sensitivity of the detector in accordance wth the teaching of U.S. Pat. No. 5,286,976.A vertical post 36 is provided to connect both mechanically and electrically the lower section 33 and the upper detector planar section 38 of the pixel. More specifically, post 36 is made of a conductor such as aluminum that has its lower end as shown in FIG. 2 electrically connected to the integrated circuit means 32 and mechanically supported on substrate 31. Referring to FIG. 4, it is seen that there are two diagonally positioned posts 36 and 36AA. The upper ends of posts 36 and 36AA are adapted to be connected to the ends of the leg portions 41 and 42 of the detector 40 discussed below.

In FIG. 2, it is seen that the upper detector planar section 38 is spaced from and is positioned immediately above the lower section 33; again a spacing of 1.8 microns is used in the preferred embodiment.

Figure 3:
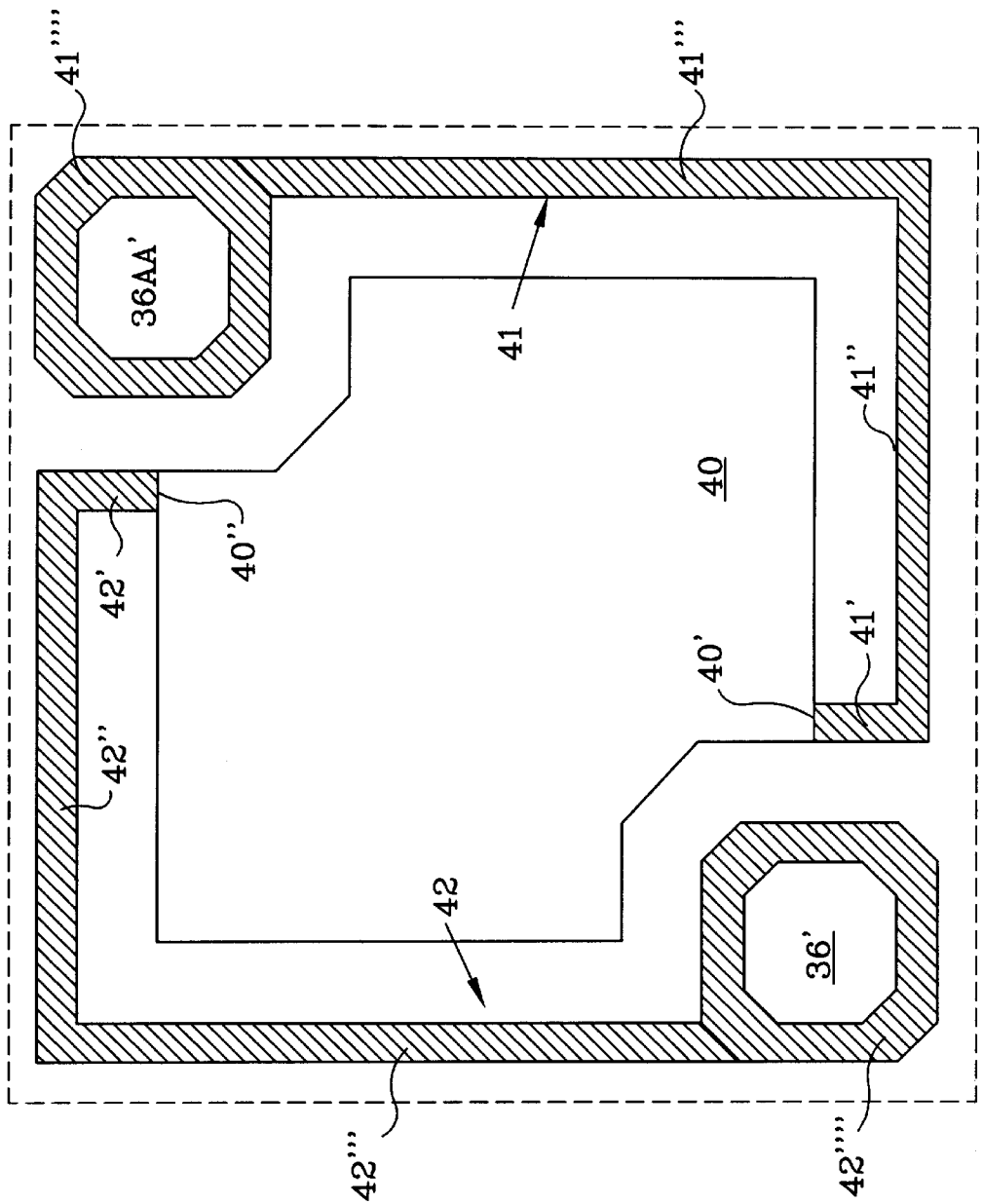
FIG. 3 is a top or plan view of the temperature responsive detector 40.

The upper detector planar section 38 comprises in part a temperature responsive detector 40 of VOx (an oxide of vanadium) and shown in FIGS. 2 and 3; this material is characterized by having a high temperature coefficient of resistance (TCR) and a resistivity in the range of 5K ohms to 300K ohms per square sheet resistance. For example, one successful embodiment of the present invention comprised, in part, a detector 40 having a VOx film thickness of 700 and a resistivity of 50K ohms per square sheet resistance. The top plan view of the temperature responsive detector 40 is shown in FIG. 3. It is shown to have a generally square shape except for notches in two opposite corners to thus provide a high form factor, i.e., area available for sensing infrared energy. Reference numerals 40' and 40" identify spaced apart regions of the sensor 40; more specifically region 40' is most proximate to the top 36' of post 36 and region 40" is most proximate to the top 36AA' of post 36AA. Integrally connected (both mechanically and electrically) with detector 40 are a pair of legs 41 and 42 also of an oxide of vanadium. As shown in FIG. 3, leg 41 is connected to detector 40 at region 40' with a short downwardly extending section 41', thence a horizontal extending section 41", thence a long vertical extending portion 41'" which terminates with a generally hollow square shaped section or connector 41"" adapted to be electrically connected to the top 36AA' of aluminum post 36AA.

In the same manner, the leg 42 is connected to sensor layer 40 at 40" and comprises a short upwardly (as shown in FIG. 3) extending vertical section 42', thence a horizontal extending section 42", thence a vertical downwardly extending section 42'" terminating in a generally hollow shaped section or connector 42"" adapted to be electricaly connected to the top 36' of aluminum post 36.

A dielectric layer 49 may be provided on the underside of the sensor layer 40 including legs 41 and 42; it can contribute to the mechanical support of the sensor by the legs 41 and 42.

An absorber layer 54 may be provided on the underside of the dielectric layer as shown in FIG. 2 to increase the sensitivity of the sensor.

A top dielectric layer 50 of silicon nitride is added on top of layer 40 as is shown both in FIGS. 2 and 4. Post caps 52 and 52AA are added on top of connectors 42"" and 41"" respectively as shown in FIG. 4, an intermediate layer 52 being of a suitable material such as Cr.

A very unique aspect of this invention is the utilization of an oxide of vanadium for the legs for supporting the upper detector planar section 38 which includes the detector 40 of an oxide of vanadium. First of all, the legs 41 and 42 provide excellent thermal isolation of the upper detector planar section from the aluminum posts 36 and 36AA, and by extension, from the upper surface of the underlying substrate 31 with its associated integrated circuit means 32. However, the utilization of untreated oxide of vanadium for the legs 41 and 42 would have an unacceptably high impedance for providing an electrical connection between the sensor 40 and the integrated circuit mean in the substrate. This apparent disadvantage has been removed and, in fact, is converted to an advantage through the use of a unique processing step following the deposition and patterning of a film of high TCR oxide of vanadium with its attendant properties of a very high sheet resistance. The steps required for the solution of the problem is to first passivate the oxide of vanadium and then expose the areas where it is desired to have low electrical resistance, e.g., the legs 41 and 42. The exposed legs then are subjected to an argon gas back sputtering process which then dramatically drops the resistance of the exposed films to a sheet resistance in the range of 250 ohms to 1,000 ohms per square sheet resistance. An example of a successful embodiment of this invention is to have the legs 41 and 42 with a film thickness of 700 Angstroms and a sheet resistivity of 500 ohms.

The advantage of the present invention can be measured in part by a knowledge that the prior art microbolometer "wet etch" process as set forth, in part, in U.S. Pat. No. Reissue 36,136 required 12 photo lithography steps and fourteen depositions following the fabrication of the read out electronics or semiconductor means in the substrate. The relatively large number of steps and depositions translates directly to device manufactoring costs for fabrication as well as minimum size constraints through density of features when avoiding coincident edge features.

In contrast, the present invention using "dry etch" (oxygen plasma) processing, has a reduced number of independent process steps. Further the prior art device/process used a very narrow NiCr layer 14 to form an interconnect between the high TCR VOx material 14 and the readout electronics 12'; the present invention avoids that expensive complexity by the provisions of legs 41 and 42 which (a) support sensor 40, and provide thermal isolation for sensor 40, and (3) provide an electrical connection means Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than be the foregoing description, and all changes which come within the meaning and range of equivalency of the claims are intented to be embraced therein.

What is claimed is:

1. A two-level microbridge infrared thermal detector apparatus comprising:

a pixel on a semiconductor substrate, said pixel having a lower section on the surface of said substrate and an upper detector planar section spaced from and immediately above said lower section;

said lower section including integrated circuit means;

said upper detector planar section (a) comprising a temperature responsive detector of an oxide of vanadium characterized by having a high TCR and a resistivity in the range of 5K ohms to 300K ohms per square sheet resistance, and (b) being supported above said lower section by leg portions of an oxide of vanadium characterized by having a resitivity in the range of 250 to 1,000 ohms per square sheet resistance; and said leg portions (a) being electrically connected to said detector and said integrated circuit means, and (b) providing thermal isolation for said temperature responsive detector.

2. The thermal detector apparatus of claim 1 further characterized by an array of said pixels being positioned on a common semiconductor substrate.

3. The thermal detector apparatus of claim 2 further characterized by the upper detector planar section of each of said pixels including absorber means.

4. The thermal detector apparatus of claim 3 further characterized by including a reflective layer on said substrate below said upper detector section.

5. A two-level microbridge infrared thermal detector appratus comprising:

a pixel on a semiconductor substrate, said pixel having a lower section the surface of said substrate and an upper detector planar section spaced from and immediately above said lower section;

said lower section including integrated circuit means;

said upper detector planar section (a) comprising a temperature responsive detector of an oxide of vanadium characterized by having a high TCR and a resistivity in the range of 20K ohms to 50K ohms per square sheet resistance and (b) being supported above said lower section by leg portions of an oxide of vanadium characterized by having a relatively low resitivity; and said leg portions (a) being electrically connected to said detector and said integrated circuit means, and (b) providing thermal isolation for said temperature responsive detector.

6. Apparatus or claim 5 further characterized by the ratio of the resistivity of said upper detector planar section to the resistivity of said upper detector planar section to the resistivity of said leg portion being in the range of 10:1 to 600:1.

7. The thermal detector apparatus of claim 6 further characterized by an array of said pixels being positioned on a common semiconductor substrate.

8. The thermal detector apparatus of claim 7 further characterized by the upper detector planar section of each of said pixels including absorber means.

9. The thermal detector apparatus of claim 8 further characterized by including a reflective layer on said substrate below said upper detector section.

10. A two-level microbridge uncooled infrared thermal detector apparatus comprising:

and array of pixels on a semiconductor substrate, each of said pixels having a lower section on the surface of said substrate and associated upper detector planar section spaced from and immediately above said lower section;

each of said lower section including integrated circuit means; and each of said upper detector planar sections (a) comprising a temperature responsive detector of an oxide of vanadium characterized by having a high TCR and a resistivity in the range of 5K ohms to 300K ohms per square sheet resistance, and (b) being electrically connected to the integrated circuit means of its associated lower section by conductors of and oxide of vanadium characterized by having a resistivity in the range of 250 to 1,000 ohms per square sheet resistance.

11. The thermal detector apparatus of claim 10 further characterized by said conductors being leg portions which support said upper detector planar sections above their respective lower sections.

12. The thermal detector apparatus of claim 10 further characterized by said conductors (i) supporting said upper detector planar sections above their respective lower sections, and (ii) providing thermal isolation for said temperature responsive detectors.

13. The thermal detector apparatus of claim 12 further characterized by the upper detector planar sections including absorber means.

14. The thermal detector apparatus of claim 13 further characterized by including a reflective layer on said substrate below each of said upper detector planar sections.

15. A two-level microbridge uncooled infrared thermal detector appratus comprising;

an array of pixels on a semiconductor substrate, each of said pixels having a lower section on the surface of said substrate and an associated upper detector planar section spaced from and immediately above said lower section;

each of said lower sections including integrated circuit means; and each of said upper detector plan sections (a) comprising a temperature responsive detector of an oxide of vanadium characterized by having a high TCR and a resistivity in the range of 5K ohms to 300K ohms per square sheet resistance, and (b) being electrically connected to the integrated circuit means of its associated lower section by conductors of an oxide of vanadium characterized by having a relatively low resistivity.

16. The thermal detector apparatus of claim 15 further characterized by said conductors being leg portions which support said upper detector planar sections above their respective lower sections.

17. The thermal detector apparatus of claim 15 further characterized by said conductors (i) supporting said upper detector planar sections above their respective lower sections, and (ii) providing thermal isolation for said temperature responsive detectors.

18. Apparatus of claim 17 further characterized by the ratio of the resistivity of said temperature responsive detectors to the resistivity or said leg portions being in the range of 10:1 to 600:1.

19. The thermal detector apparatus of claim 18 further characterized by the upper detector planar sections including absorber means.

20. The thermal detector apparatus of claim 19 further characterized by including a reflective layer of said substrate below each of said upper detector planar sections.

* * * * *